(12) United States Patent
Bohm

(10) Patent No.: US 7,129,723 B2
(45) Date of Patent: Oct. 31, 2006

(54) TEST DEVICE FOR ELECTRICAL TESTING OF A UNIT UNDER TEST

(75) Inventor: Gunther Bohm, Nufringen (DE)

(73) Assignee: Feinmetall GmbH (DE)

( * ) Notice: Subject to any disclaimer, the term of this patent is extended or adjusted under 35 U.S.C. 154(b) by 0 days.

(21) Appl. No.: 11/100,706

(22) Filed: Apr. 7, 2005

(65) Prior Publication Data

US 2005/0264315 A1    Dec. 1, 2005

(30) Foreign Application Priority Data

May 28, 2004  (DE)  ....................... 10 2004 027 887

(51) Int. Cl.
    *G01R 31/02*    (2006.01)
(52) U.S. Cl. ..................................... 324/754
(58) Field of Classification Search ............... None
    See application file for complete search history.

(56) References Cited

U.S. PATENT DOCUMENTS

| | | | | |
|---|---|---|---|---|
| 5,825,192 A * | 10/1998 | Hagihara | ..................... | 324/757 |
| 6,078,186 A * | 6/2000 | Hembree et al. | ............ | 324/755 |
| 6,292,003 B1 * | 9/2001 | Fredrickson et al. | ........ | 324/754 |
| 6,483,328 B1 * | 11/2002 | Eldridge et al. | ............ | 324/754 |
| 6,509,751 B1 | 1/2003 | Mathieu et al. | | |
| 6,924,654 B1 * | 8/2005 | Karavakis et al. | .......... | 324/754 |
| 2002/0024354 A1 | 2/2002 | Pietzschmann | | |
| 2002/0109514 A1 | 8/2002 | Brandorff et al. | | |

FOREIGN PATENT DOCUMENTS

| | | |
|---|---|---|
| DE | 29 05 175 | 8/1980 |
| EP | 0 180 013 | 9/1985 |
| JP | 07294580 | 11/1995 |
| WO | 01/09623 A1 | 2/2001 |
| WO | WO 2004/001807 | 12/2003 |

* cited by examiner

*Primary Examiner*—Ernest Karlsen
*Assistant Examiner*—Richard Isla-Rodas
(74) *Attorney, Agent, or Firm*—Ostrolenk, Faber, Gerb & Soffen, LLP

(57) ABSTRACT

A test device for electrical testing of a unit under test, the device having a contact head which can be associated with the unit under test and is provided with contact elements pins in a contact pin arrangement, having an electrical connecting apparatus, including contact surfaces which make touching contact with first ends of the contact elements which face away from the test plane accommodating the unit under test, and having a supporting apparatus which is arranged on the side of the connecting apparatus facing away from the contact head. Pulling or pushing devices adjust the planar condition or a desired discrepancy from the planar condition of an arrangement of the contact surfaces and those devices are arranged between the supporting apparatus and the connecting apparatus.

11 Claims, 1 Drawing Sheet

TEST DEVICE FOR ELECTRICAL TESTING OF A UNIT UNDER TEST

BACKGROUND OF THE INVENTION

The invention relates to a test device for electrical testing of a unit under test, in particular for the testing of wafers. The device has a contact head which can be associated with the unit under test and is provided with contact elements which are in the form of pins and form a contact pin arrangement. The device further has an electrical connecting apparatus, which has contact surfaces which make a touching contact with those ends of the contact elements which face away from the test plane accommodating the unit under test. The device also has a supporting apparatus which is arranged on the side of the connecting apparatus facing away from the contact head.

Electrical test devices of this type initially are used to make electrical contact with a unit under test in order to test its functionality and serviceability. The electrical test device produces electrical connections to the unit under test, that is to say it makes contact on the one hand with electrical connections on the unit under test and on the other hand provides electrical contacts which are connected to a test system which supplies electrical signals to the unit under test via the test device in order to carry out, for example, resistance measurements, current and voltage measurements and so on for functional testing. Since the electrical units under test are often very small electronic components, for example electronic circuits on a wafer from which electronic components are manufactured, the contact elements, which are in the form of pins, on the test head have extremely small dimensions. In order now to provide a connection capability to the test system that has been mentioned, the contact elements of the test head make touching contact with a connecting apparatus which provides conversion to a greater contact separation and to this extent, allows the connection of electrical connecting cables which lead to the test system. During testing, the unit under test is located on the test plane, and the test device is lowered axially, preferably in the vertical direction, onto the unit under test. The first ends of the contact elements, which are in the form of pins, make contact with the unit under test. The other ends of the contact elements, which are in the form of pins, meet the contact surfaces of the connecting apparatus. The supporting apparatus applies the contact force, in the axial direction, which is applied to the unit under test in order to make the contacts that have been mentioned. At the same time, the support for the connecting apparatus, which is often flat, on the supporting apparatus counteracts any bending of the connecting apparatus resulting from reaction forces caused by making contact with the unit under test. Nevertheless, manufacturing tolerances and external conditions mean that there is no guarantee that the contact pins of the contact pin arrangement will make contact with the unit under test with approximately the same contact pressure. Even a minor deviation from the planar condition of a component can lead to a certain proportion of the contact pins making contact with the unit under test at an early stage during the lowering process, and also being pressed against the unit under test with a greater contact pressure than the other contact pins during testing. In the worst case, it is possible in the case of the known test device for certain contact pins to make no contact with the unit under test, even though other contact pins are resting against the unit under test with the desired contact pressure. The contact pins compensate for minor discrepancies themselves, since they are preferably in the form of bent wires on which forces act in the longitudinal direction while making contact and which are in consequence easily elastically bent in the form of an arc. However, this compensation is not always adequate.

SUMMARY OF THE INVENTION

The invention is thus based on the object of providing an electrical test device of the type mentioned initially which always insures that reliable contact is made with the unit under test.

According to the invention, this object is achieved in that pulling means and/or pushing means for adjustment of the planar condition or of a desired discrepancy from the planar condition of the arrangement of the contact surfaces are arranged between the supporting apparatus and the connecting apparatus. The adjustment of the pulling means and/or pushing means results in the supporting apparatus acting on the connecting apparatus in such a way that the latter is deformed, preferably elastically, such that the contact surfaces which are arranged in a distributed form are moved through a corresponding distance in the axial direction of the test device, preferably in the vertical direction. This, for example, makes it possible to achieve the planar condition of the arrangement of the contact surfaces. This is possible when the unit under test is in a correct planar form and, apart from this, no components of the test device have any discrepancies either as a result of manufacturing tolerances or external influences, while only the connecting apparatus does not have the correct planar condition which is then, however, produced according to the invention.

According to another application, it is also possible, however, to provide for the unit under test which, is in the form of a wafer, not to have the correct planar condition, resulting in the contact elements having different contact pressures, to the extent that some contact elements do not make contact. This can be overcome by means of the pulling means and/or pushing means, which can be adjusted appropriately, wherein the arrangement of the contact surfaces of the connecting apparatus is adjusted with respect to the planar condition or so as to deliberately produce a desired degree of non-planar condition, in order to counteract the discrepancies which have been mentioned. The pulling means and/or pushing means furthermore allow matching to the respective contact-making task, which is necessary when the test device has to operate with contact-making forces of different magnitude. If, for example, the units under test have only a small number of test points, then only a small number of contact pins are required and only a correspondingly small contact force need be applied for the test. If a unit under test has a very large number of contact points, so that a very large number of contact pins are used, a considerably greater contact force must be applied in order to produce the same individual contact-making force for each pin. The connecting apparatus is accordingly loaded to a greater extent and may thus be deformed somewhat as a result of reaction forces, which once again leads to movement of corresponding contact surfaces. The pulling means and/or pushing means which have been mentioned make it possible to preset the planar condition or non-planar condition of the connecting apparatus which, as mentioned, is flat, and, for example, is formed by a printed circuit board.

It is also advantageous for the pulling means and/or pushing means to allow thermal expansion of the connecting apparatus on a plane which runs parallel to the test plane. Since the room temperatures during testing may differ and/or the testing is also preferably carried out at different unit under test temperatures in order to make it possible to test the operation of the unit under test within a specific temperature range as well, temperature-dependent length changes of the individual components occur, in particular on planes parallel to the test plane. These length changes are unavoidable and are not impeded by the pulling and/or pushing means if they allow changes on the planes which have been mentioned. This situation is achieved, in particular, by the pulling means and/or pushing means being in the form of pendular pulling means and/or pendular pushing means. Mechanical rigidity is provided in the longitudinal extent of the pulling means and/or pushing means in order to apply the desired pulling forces and/or pushing forces, although corresponding movement as a result of pendular movement is possible transversely with respect to this longitudinal extent, so that expansions of the length, as have been mentioned, are not impeded. In this case, it should be noted that tests on wafers are carried out, for example, in the temperature range from −40° C. to +150° C.

One development of the invention provides that two or more pulling means and/or pushing means are provided distributed (preferably distributed like a matrix) in the central area of the test device, in particular in the base surface area of the contact pin arrangement. This central area is used to hold the contact pins and thus represents the test area. If the pulling means and/or pushing means are located in this area, then they can be axially aligned or deformed appropriately in order to produce the desired planarity or non-planarity.

It is advantageous for the pulling means and/or pushing means to have threaded pins which interact with adjusting nuts in order to apply pulling forces and/or pushing forces. Adjustment of an adjusting nut on the associated threaded pin leads to the application of pushing forces when the adjusting nut is rotated in one direction, and to the production of pulling forces when the adjusting nut is rotated in the other direction. In this case, furthermore, the magnitude of the pushing forces and the magnitude of the pulling forces can be varied by rotating the adjusting nut through a corresponding distance, so that individual, continuously variable adjustment is possible.

It is also advantageous for the first ends of the threaded pins to be attached to the connecting apparatus and for the adjusting nuts to be supported on the supporting apparatus. The adjusting nuts are then still externally accessible and can easily be adjusted as appropriate for calibration of the test device.

In particular, those ends of the threaded pins which are associated with the connecting apparatus are provided with heads which are held by holding caps that are attached to the connecting apparatus. The heads are held in a pendular manner in the holding caps so as not to impede the thermal length changes that occur.

The threaded pins are preferably located in aperture openings in the supporting apparatus, or project through these aperture openings. In this case, the aperture openings are preferably in the form of stepped holes each having a hole section with a smaller diameter and a hole section with a larger diameter, with the adjusting nuts being located in the hole sections with the larger diameter, which are located on the outside of the supporting apparatus, and with the adjusting nuts being supported on the one hand on the steps in the stepped holes, and on the other hand on closure pieces in the hole sections having the larger diameter. This means that rotation of the adjusting nuts allows pushing forces or pulling forces originating from the supporting apparatus to be exerted on the connecting apparatus by means of the individual threaded pin arrangements.

The closure pieces may preferably be in the form of clamping pieces for the adjusting nuts. This allows an adjusting nut which has been set to a desired rotation position to be locked by clamping, in order to prevent inadvertent displacement.

Finally, it is advantageous for the closure pieces to be eyebolts whose external threads are screwed into the internal thread in the hole sections having the larger diameter. Rotation of an eyebolt such as this leads to it being moved axially, with the consequence that the associated adjusting nut has a clamping force applied to it and is thus secured or released.

Other features and advantages of the present invention will become apparent from the following description of the invention which refers to the accompanying drawings.

BRIEF DESCRIPTION OF THE DRAWINGS

The drawings illustrate the invention with reference to an exemplary embodiment.

DESCRIPTION OF A PREFERRED EMBODIMENT

Figure 1:
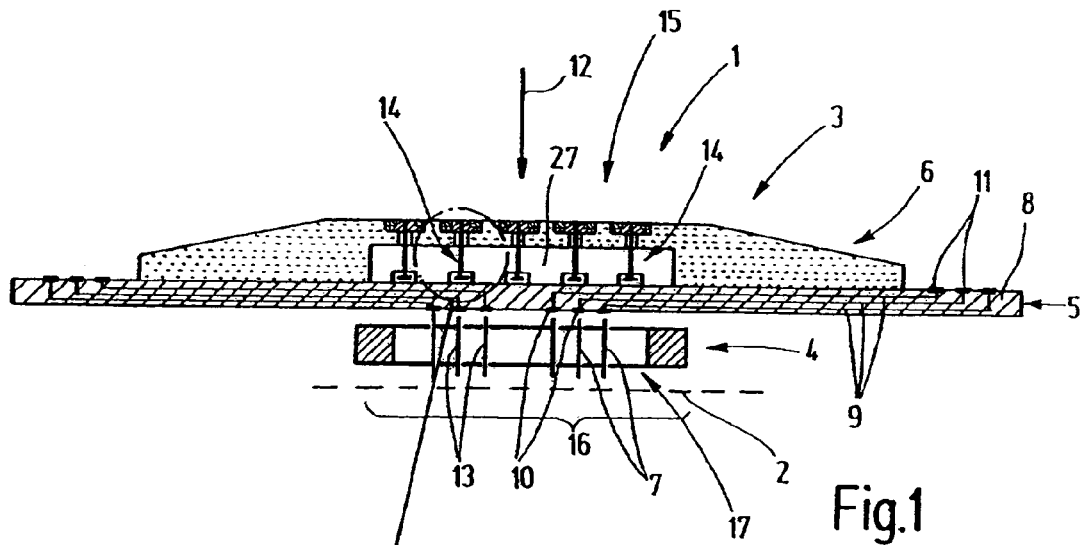
FIG. 1 shows a schematic cross-sectional view of a test device.

FIG. 1 shows a schematic illustration of a cross section through an electrical test device 1 which can be connected to a test system (which is not illustrated) by means of an electrical cable connection (which is not illustrated) in order to make contact with a unit under test (which is not illustrated), in order to subject the unit under test to an electrical test. The unit under test, which may be in the form of a wafer, is located on the test plane 2, which is shown as a dashed line in FIG. 1. The test device 1 that is being mentioned and is also referred to as a vertical test edge 3 is used to make contact with the appropriate connecting points on the unit under test. The test device 1 has a contact head 4, a connecting apparatus 5 and a supporting apparatus 6.

The connecting apparatus 5 is supported by the supporting apparatus 6. The contact head 4 is provided with a large number of contact elements 7 which are mounted such that they can move longitudinally, and whose first end areas are associated with the unit under test (which is not illustrated), while their other end areas are associated with the connecting apparatus 5. The connecting apparatus 5 is in the form of a multilayer printed circuit board 8 with conductor tracks 9, with the conductor tracks 9 having contact surfaces 10 at their ends associated with the contact head 4, and having electrical connecting surfaces 11 at their radially outer ends, in which case the latter can be connected to the test system via the cable connections which have been mentioned but are not illustrated. The arrangement is designed such that the connecting apparatus 5 forms an adapter apparatus, that is to say the very short distance between the very small contact surfaces 10 is converted via the conductor tracks 9 to greater distances between the connecting surfaces 11. Furthermore, the connecting surfaces 11 are each of a size to allow the cable connections that have been mentioned to be produced.

Figure 2:
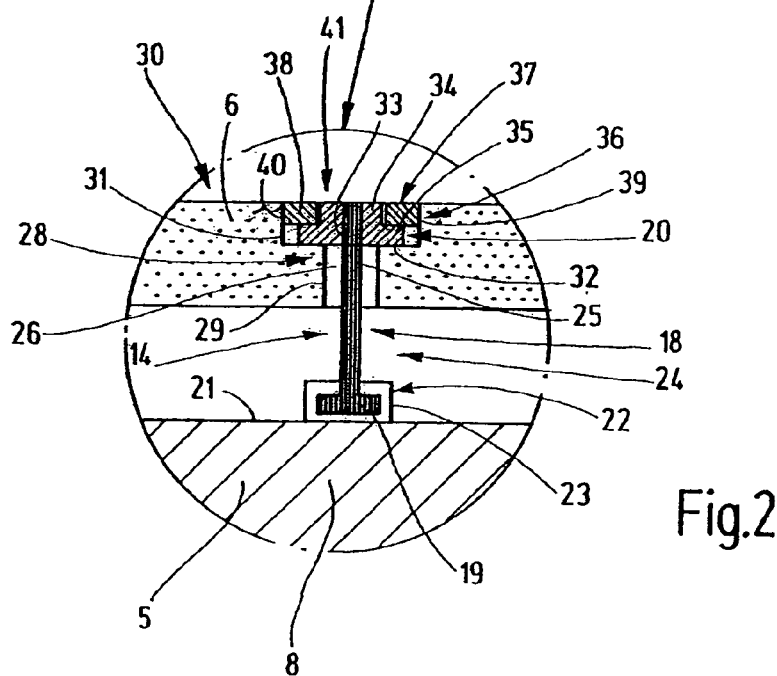
FIG. 2 shows an enlarged illustration of one area of the test device shown in FIG. 1.

While testing the unit under test, the supporting apparatus 6 is moved in the axial direction (arrow 12) toward the unit under test, which is located on the test plane 2, so that the ends of the contact elements 7 on the one hand make contact with the unit under test, and on the other hand make contact with the contact surfaces 10. Since the contact elements 7 are in the form of bent wires 13, that is to say they are designed such that they are slightly resilient in the axial direction by bending, correct contact with the unit under test is possible when the individual components of the test device 1 and of the unit under test as well each have a sufficient planar condition. Problems occur when those ends of the bent wires 13 which are associated with the connecting apparatus 5 are all located on a plane, but the associated contact surfaces 10 of the connecting apparatus 5 are not in the form of a planar arrangement owing to, for example, convex bending of the printed circuit board 8. In order to allow the planar condition or deliberate non-planar condition of the connecting apparatus 5 to be influenced, the pulling and pushing means 14 are arranged between the supporting apparatus 6 and the connecting apparatus 5. A large number of pulling and pushing means 14 are provided and are arranged like a matrix in the central area 15 of the test device 1. In this case, in particular, the base surface area 16 of the contact pin arrangement 17 of the contact head 4 is provided with pulling and pushing means 14. The enlarged illustration in FIG. 2 shows that each pulling and pushing means 14 has a threaded pin 18 with a head 19, with an adjusting nut 20 being screwed onto the threaded pin 18. Holding caps 22 are mounted, preferably by adhesive bonding, on the upper face 21 of the printed circuit board 8, have C-profiled shapes 23 in cross section, and hold the heads 19 of the pulling and pushing means 14. If the respective head 19 is held in the C-profiled shape 23 with a certain amount of play, then the pulling and pushing means 14 represent a pendular pulling means or pendular pushing means 24, respectively. However, alternatively, it is also possible to adhesively bond the head into the C-profiled shape, with pendular compensation being possible by bending of the pulling and pushing means 14. The free end area 25 of the respective threaded pin 18 projects into an aperture opening 26 in the supporting apparatus 6. The supporting apparatus 6 is provided with a hollow area 27 (FIG. 1) on its side facing the connecting apparatus 5 in order to hold the holding caps 22 and sections of the threaded pins 18. As can be seen from FIG. 2, each aperture opening 26 is in the form of a stepped hole 28, that is to say it has a hole section 29 with a smaller diameter, which is associated with the connecting apparatus 5, and has a hole section 31 with a larger diameter, which leads to the outer face 30 of the supporting apparatus 6. This results in an annular step 32.

The internal thread 33 on the adjusting nut 20 is screwed onto the end 25 of the threaded pin 18 and has a central area 34 with a smaller diameter and, integrally with it, an outer annular flange 35 with a larger diameter. The lower face of the annular flange 35 is supported on the annular step 32.

A closure piece 36 is arranged within the hole section 31 and can rest in a clamping manner on the annular flange 35 of the adjusting nut 20, thus making it possible to fix the rotation position of the adjusting nut 20 between the annular step 32 and the closure piece 36. The closure piece 36 thus forms a clamping piece 37 and is in the form of an eyebolt 38 which has an external thread 39 on its external diameter, which engages with an internal thread 40 in the hole section 31. Furthermore, the arrangement is designed such that a central opening 41 in the eyebolt 38 holds that area 34 of the adjusting nut 20 which has the smaller diameter.

This results in the following function: For calibration of the test device 1, it is lowered onto a unit under test that is located on the test plane 2, so that the bent wires 13 on the one hand make electrical contact with the unit under test and on the other hand make electrical contact with the test system, which is not illustrated, via the contact surfaces 10, the conductor tracks 9 and connecting surfaces 11, as well as the cable connections which are not illustrated. During the lowering process, a test system monitor is used to display the lowering state in which contact elements 7 make contact with the unit under test. If it is found, for example, that the contact elements 7 located on the right-hand side in FIG. 1 make contact with the unit under test prematurely and with a greater contact pressure than the contact elements 7 which are located on the left-hand side, as is evident by means of a corresponding image on the test system monitor, then the pulling and pushing means 14 can be used to implement a desired correction. This may comprise the pulling and pushing means 14 which are located on the right-hand side exerting greater tension, and/or the pulling and pushing means 14 located on the left-hand side exerting greater pressure, from the supporting apparatus 6 on the printed circuit board 8, so that the latter is slightly elastically deformed, resulting in appropriate axial vertical movement of the contact surfaces 10.

Pushing forces can be applied by (if the threaded pin 18 has a right-handed thread and the eyebolt 38 is loosened) the adjusting nut 20 being moved somewhat further away from its head 19 by counterclockwise rotation, and then by the annular flange 35 being clamped between the eyebolt 38 and the annular step 32 by tightening the eyebolt 38. On the other hand, a pulling force can be applied by after loosening the eyebolt 38 rotating the adjusting nut 20 in the clockwise direction, during which process it is supported on the annular step 20 and in consequence transmits the pulling force via the C-profiled shape 23 of the holding cap 22 to the printed circuit board 8. The eyebolt 35 is then tightened again, in order to clamp the annular flange 38 of the adjusting nut 20 in order to fix it. This allows the planar condition or non-planar condition of the connecting apparatus 5, and thus of the arrangement of their contact surfaces 10, to be adjusted at a correspondingly large number of points, specifically by each pulling and pushing means 14.

As can be seen from FIG. 2, the hole section 29 has a larger diameter than the diameter of the threaded pin 18, so that this also allows a certain amount of pendular deflection of the threaded pin 18 when thermal expansion occurs in the components which are located on a plane which runs parallel to the test plane 2.

In order to make it possible to carry out the rotary adjustments of the adjusting nut 20 and/or eyebolt 38 that have been mentioned, these two components have a tool engagement slot on their upper face, so that they can each be adjusted without any problems by means of a screwdriving tool in the form of a fork.

The invention makes it possible to adjust and to fix the vertical, that is to say axial, position of the connecting apparatus 5, in particular of the printed circuit board 8 at various points, thus allowing optimum contact to be made with the unit under test.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A test device for electrical testing of a unit under test comprising:
a contact head which is associated with the unit under test;
contact elements on the head comprising pins arrayed to form a contact pin arrangement, the contact elements having first ends toward a test plane accommodating the unit under test and having second ends which face away from the test plane accommodating the unit under test;

an electrical connecting apparatus including contact surfaces which are positioned in such an arrangement and are operable to make touching contact with the second ends of the contact elements;

a supporting apparatus arranged on a side of the connecting apparatus facing away from the contact head;

pulling and pushing devices for adjusting a planar condition or a desired discrepancy from the planar condition of the arrangement of the contact surfaces, and the pulling and pushing devices are arranged between the supporting apparatus and the connecting apparatus.

2. The test device according to claim 1, wherein the pulling and pushing devices are adapted to allow thermal expansion of the connecting apparatus or of other parts of the test device on a plane which runs parallel to the test plane.

3. A test device according to claim 2, wherein the pulling and pushing devices are in the form of pendular pulling and pendular pushing devices in order to allow thermal expansion of the connecting apparatus or of other parts of the test device.

4. A test device according to claim 1, further comprising at least two of the pulling and pushing devices distributed in a central area of the test device and in a base surface area of the contact pin arrangement.

5. A test device according to claim 1, wherein the pulling and pushing devices include threaded pins which interact with adjusting nuts to apply pulling or pushing forces.

6. A test device according to claim 5, wherein first ends of the threaded pins are attached to the connecting apparatus, and the adjusting nuts are supported on the supporting apparatus.

7. A test device according to claim 6, wherein second ends of the threaded pins are associated with the connecting apparatus and are provided with heads which are held by holding caps that are attached to the connecting apparatus.

8. The test device according to claim 5, further comprising aperture openings in the supporting apparatus in which the threaded pins are located or through which aperture openings the threaded pins project.

9. The test device according to claim 8, wherein the aperture openings comprise stepped holes, each hole having a first hole section with a smaller diameter and a second hole section with a larger diameter, the adjusting nuts being located in the second hole sections with the larger diameter, and the second hole sections are located on the outside of the supporting apparatus, and the adjusting nuts are supported on the steps in the stepped holes and on closure pieces in the second hole sections having the larger diameter.

10. The test device according to claim 9, wherein the closure pieces are clamping pieces for the adjusting nuts.

11. The test device according to claim 10, wherein the closure pieces are eyebolts having external threads that are screwed into the internal thread in the second hole sections having the larger diameter.

* * * * *